(12) United States Patent
Tabatake et al.

(10) Patent No.: US 11,966,528 B2
(45) Date of Patent: Apr. 23, 2024

(54) DISPLAY DEVICE

(71) Applicant: Japan Display Inc., Tokyo (JP)

(72) Inventors: Hiroshi Tabatake, Tokyo (JP); Hideyuki Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/184,730

(22) Filed: Mar. 16, 2023

(65) Prior Publication Data

US 2023/0214042 A1 Jul. 6, 2023

Related U.S. Application Data

(63) Continuation of application No. 17/656,918, filed on Mar. 29, 2022, now Pat. No. 11,630,529.

(30) Foreign Application Priority Data

Mar. 30, 2021 (JP) .................. 2021-057693

(51) Int. Cl.
*G06F 3/041* (2006.01)
*H10K 59/131* (2023.01)
*H10K 59/40* (2023.01)

(52) U.S. Cl.
CPC .......... *G06F 3/0412* (2013.01); *G06F 3/0416* (2013.01); *G06F 3/04166* (2019.05); *H10K 59/1315* (2023.02); *H10K 59/40* (2023.02)

(58) Field of Classification Search
CPC ............. G06F 3/0412; G06F 3/04166; H10K 59/1315; H10K 59/40; H10K 59/80521
See application file for complete search history.

(56) References Cited

U.S. PATENT DOCUMENTS

| 2017/0010724 A1 | 1/2017 | Cao et al. |
| 2017/0090622 A1 | 3/2017 | Badaye et al. |
| 2017/0090633 A1 | 3/2017 | Kwon et al. |
| 2019/0004355 A1 | 1/2019 | Zeng et al. |
| 2020/0125202 A1 | 4/2020 | Li et al. |

FOREIGN PATENT DOCUMENTS

JP 2008135325 A 6/2008

*Primary Examiner* — Robin J Mishler
(74) *Attorney, Agent, or Firm* — Maier & Maier, PLLC

(57) ABSTRACT

According to one embodiment, a display device includes a base, a display unit containing pixels, a power supply circuit, a touch controller and a switching circuit disposed between the display unit, the power supply circuit and the touch controller. The pixels each includes a pixel circuit and a display element including a lower electrode connected to the pixel circuit, an upper electrode disposed to oppose the lower electrode and an organic layer including a light-emitting layer disposed between the lower electrode and the upper electrode. The upper electrode is connected to the switching circuit, and the switching circuit selectively switches between connecting the upper electrode to the power supply circuit and connecting the upper electrode to the touch controller.

6 Claims, 4 Drawing Sheets

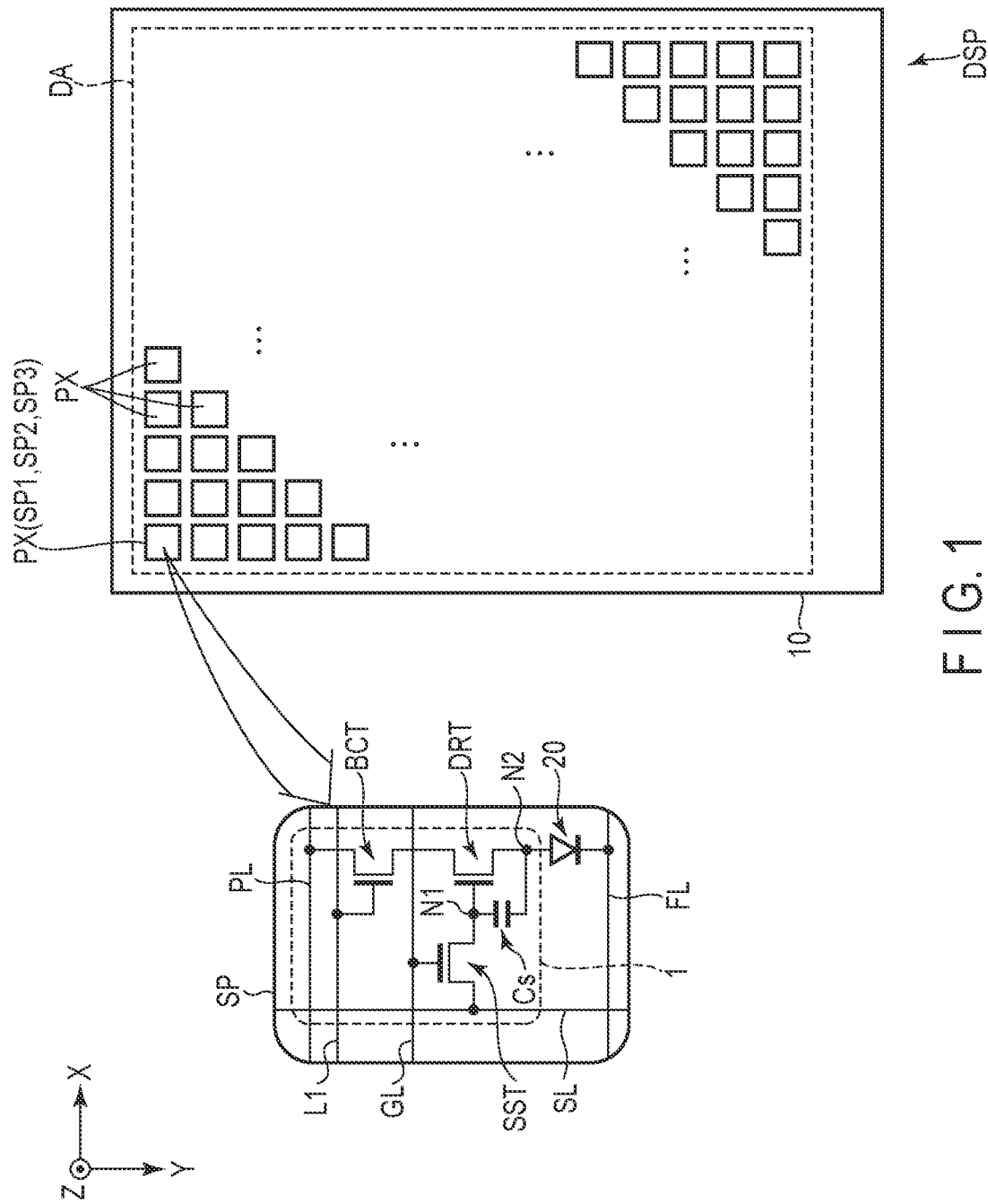
F I G. 1

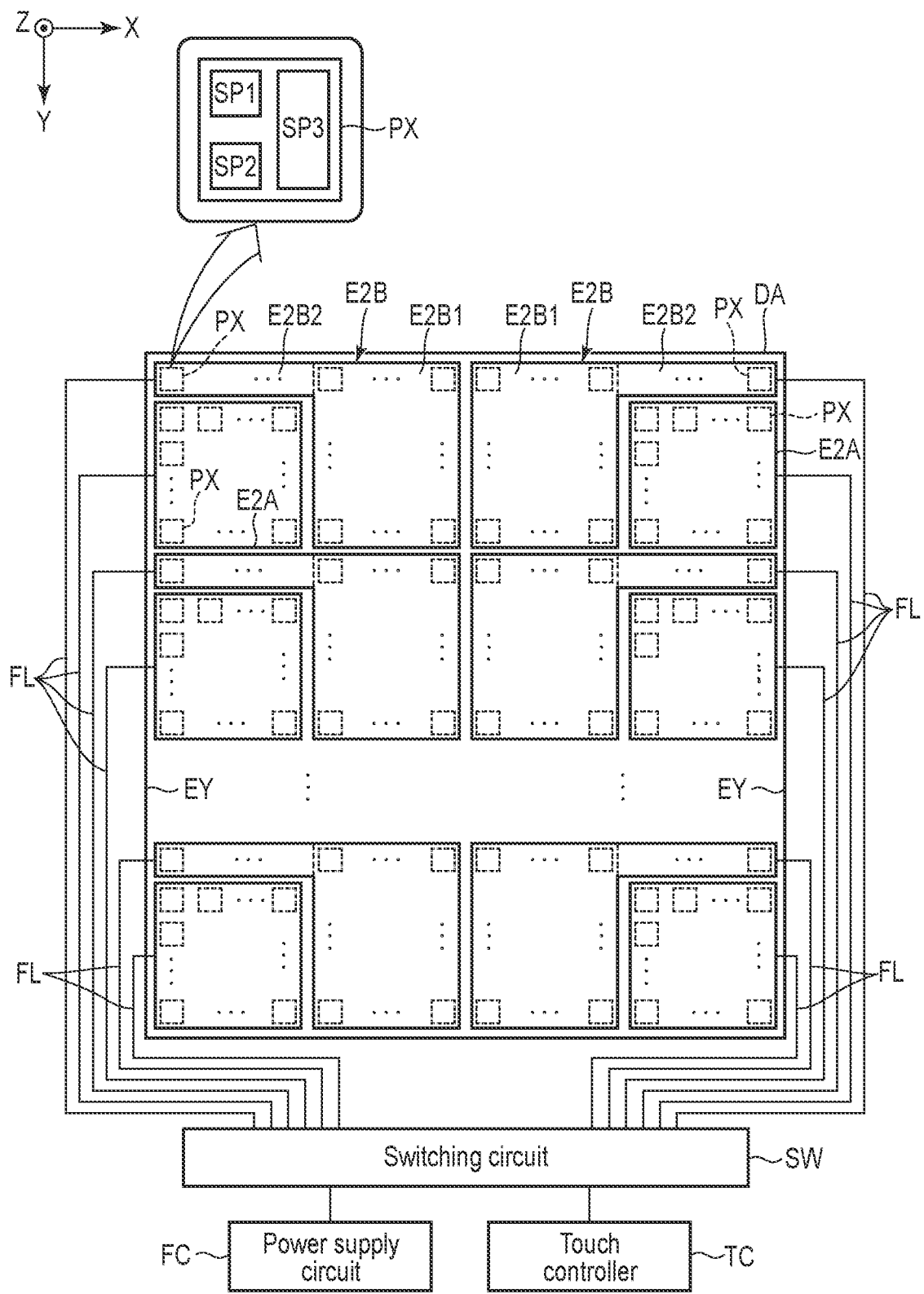
F I G. 3

DISPLAY DEVICE

CROSS-REFERENCE TO RELATED APPLICATIONS

This application is a continuation of U.S. application Ser. No. 17/656,918 filed Mar. 29, 2022, which is based upon and claims the benefit of priority from Japanese Patent Application No. 2021-057693, filed Mar. 30, 2021, the entire contents of each of which are incorporated herein by reference.

FIELD

Embodiments described herein relate generally to a display device.

BACKGROUND

In recent years, display devices in which an organic light-emitting diode (OLED) is applied as a display element have been used in practical applications. Such display devices comprise an organic layer between the pixel electrode and the common electrode. The organic layer includes functional layers such as a hole transport layer and an electron transport layer in addition to the light-emitting layer.

In some cases, an external touch sensor is added to such a display device to provide a touch detection function. In this case, however, the thickness of the display device is increased by the addition of the external touch sensor, and the manufacturing cost and number of manufacturing processes of the display device increase.

BRIEF DESCRIPTION OF THE DRAWINGS

FIG. 1 is a diagram showing a configuration example of a display device according to an embodiment.

FIG. 3 is a diagram showing a configuration example of the display device according to the embodiment.

DETAILED DESCRIPTION

Figure 2:
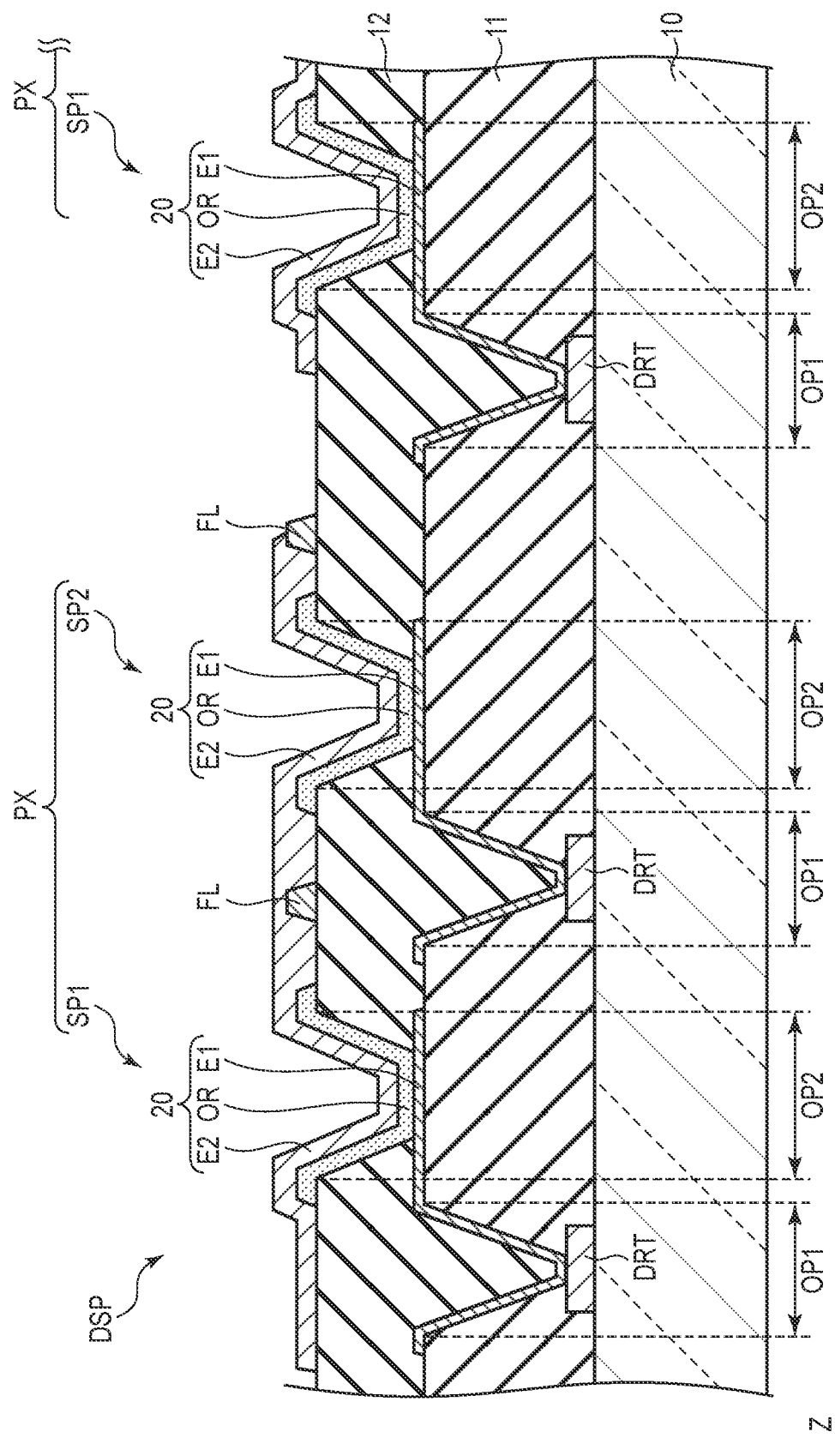
FIG. 2 is a cross-sectional view of a configuration example of subpixels shown in FIG. 1.

In general, according to one embodiment, a display device comprises a base, a display unit containing a plurality of pixels arranged in a matrix along a first direction and a second direction intersecting the first direction on the base, a power supply circuit that supplies a potential to the display unit for displaying an image, a touch controller that detects a touch with respect to the display unit and a switching circuit disposed between the display unit, the power supply circuit and the touch controller, and the plurality of pixels each includes a pixel circuit disposed on the base and a display element including a lower electrode connected to the pixel circuit, an upper electrode disposed to oppose the lower electrode and an organic layer including a light-emitting layer disposed between the lower electrode and the upper electrode, and the upper electrode is connected to the switching circuit, and the switching circuit selectively switches between connecting the upper electrode to the power supply circuit and connecting the upper electrode to the touch controller.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

In some of the embodiments, a display device DSP is an organic electroluminescent display comprising an organic light-emitting diode (OLED) as the display element, and having a touch detection function, which can be installed, for example, in television sets, personal computers, mobile terminals, cell phones and the like. Note that the display elements described below can be applied as a light-emitting element in an illumination device, and the display device DSP can be diverted to other electronic devices such as illumination devices.

FIG. 1 is a diagram showing a configuration example of the display device DSP according to this embodiment. Of the configuration of the display device DSP, the portion related to display of images will be described with reference to FIG. 1. The display device DSP comprises a display unit DA that displays images, on an insulating base 10. The base 10 may be glass or a flexible resin film.

The display unit DA comprises a plurality of pixels PX arranged in a matrix along the first direction X and the second direction Y. The pixels PX each comprises a plurality of subpixels SP1, SP2 and SP3. For example, the pixel PX comprises a red subpixel SP1, a green subpixel SP2 and a blue subpixel SP3. Note that besides the three-color subpixels mentioned above, the pixel PX may comprise four or more subpixels of other colors such as white and the like.

A configuration example of one subpixel SP contained in the pixel PX will now be briefly described.

The subpixel SP comprises a pixel circuit 1 and a display element 20 that is driven and controlled by the pixel circuit 1. The pixel circuit 1 comprises a pixel selection switch SST, a drive transistor DRT, an output switch BCT and a capacitor Cs. The pixel selection switch SST, the drive transistor DRT and the output switch BCT are switch elements formed from thin-film transistors (TFTs), for example, which include a gate electrode, a source electrode and a drain electrode, respectively.

In the pixel selection switch SST, the gate electrode is connected to a scanning line GL, the source electrode is connected to a signal line SL, and the drain electrode is connected to a node N1. The node N1 is connected to the drain electrode of the pixel selection switch SST, the gate electrode of the drive transistor DRT, and one of the electrodes which constitutes the capacitor Cs. When the pixel selection switch SST is turned on in response to the scanning signal supplied from the scanning line GL, it captures the video signal supplied from the signal line SL.

In the drive transistor DRT, the gate electrode is connected to the node N1, the source electrode is connected to the drain electrode of the output switch BCT, and the drain electrode is connected to a node N2. The node N2 is connected to the drain electrode of the drive transistor DRT, the other electrode that constitutes the capacitor Cs, and an anode of the display device 20. The drive transistor DRT outputs a drive current of a current amount according to the video signal described above, to the display element 20.

In the output switch BCT, the gate electrode is connected to an output control signal line L1, the source electrode is connected to a power line PL, and the drain electrode is connected to the source electrode of the drive transistor DRT. The output switch BCT is a switch to control the period of emission of the light which the display element 20 emits.

The cathode of the display element 20 is connected to a power supply line FL. Note that the configuration of the pixel circuit 1 is not limited to that of the example illustrated.

The display element 20 is an organic light-emitting diode (OLED), which is a light-emitting element. For example, the subpixel SP1 comprises a display element that emits light corresponding to a wavelength of a red color, the subpixel SP2 comprises a display element that emits light corresponding to a wavelength of a green color, and the subpixel SP3 comprises a display element that emits light corresponding to a wavelength of a blue color. With multiple subpixels SP1, SP2 and SP3 with different display colors provided in the pixel PX, it is possible to realize multiple color display.

Note, however, the display elements 20 of the subpixels SP1, SP2 and SP3 may be configured to emit light of the same color. In this way, monochromatic display can be realized.

Further, when the display elements 20 of the subpixels SP1, SP2 and SP3 are configured to emit white light, a respective color filter may be placed to oppose each display element 20. For example, the subpixel SP1 comprises a red color filter opposing the display element 20, the subpixel SP2 comprises a green color filter opposing the display element 20, and the subpixel SP3 comprises a blue color filter opposing the display element 20. With this configuration, it is possible to realize multi-color display.

When the display elements 20 of the subpixels SP1, SP2 and SP3 are configured to emit ultraviolet light, a photoconversion layer should be disposed to oppose the display element 20, and thus multi-color display can be realized.

FIG. 2 is a cross-sectional view showing a configuration example of the subpixels SP (display elements 20) shown in FIG. 1.

The pixel circuit 1 shown in FIG. 1 is placed on the base 10 and covered by an insulating layer 11. FIG. 2 shows only the drive transistor DRT contained in the pixel circuit 1 in a simplified form. The insulating layer 11 is equivalent to an underlying base layer of the display element 20, and is made of, for example, an insulating material such as polyimide, acrylic resin, silicon nitride (SiN), silicon oxide (SiO) or the like.

The display element 20 comprises a lower electrode E1, an organic layer OR and an upper electrode E2. The organic layer OR is disposed to be sandwiched between the lower electrode E1 and the upper electrode E2.

The lower electrode E1 is an electrode provided for each subpixel or each display element, and is electrically connected to the drive transistor DRT. The lower electrode E1 with such a configuration may be, in some cases, referred to as a pixel electrode, reflective electrode, anode or the like.

Although the details thereof will be provided later, the upper electrode E2 is an electrode provided for each of groups of a certain number of pixels PX. The lower electrode E2 with such a configuration may be, in some cases, referred to as a common electrode, a counter electrode, a cathode or the like.

The upper electrode E2 is electrically connected to the power supply line FL. The power supply line FL is used as a wiring line to supply signals to provide the common potential to the upper electrode E2, or as a wiring line to supply drive signals for touch detection to the upper electrode E2. Note that the power supply line FL is disposed between two adjacent organic layers OR, and has a role of dividing these organic layers OR from each other.

The lower electrode E1 is placed on the insulating layer 11 and is connected to the drive transistor DRT via an opening OP1 formed in the insulating layer 11. The opening OP1 is a through-hole formed in the area overlapping the drive transistor DRT and penetrating the insulating layer 11 to the drive transistor DRT.

The lower electrode E1 is a transparent electrode formed of, for example, a transparent conductive material such as indium tin oxide (ITO), indium zinc oxide (IZO) or the like. The lower electrode E1 may be a metal electrode formed of a metallic material such as silver (Ag), aluminum (Al), titanium (Ti), molybdenum (Mo), tungsten (W) or the like. The lower electrode E1 may also be of a stacked structure of a transparent electrode and a metal electrode. For example, the lower electrode E1 may be configured as a stacked body consisting of a transparent electrode, a metal electrodes and a transparent electrodes stacked in this order, or may be configured as a stacked body consisting of three or more layers.

An insulating layer 12 is provided on the insulating layer 11 to cover the lower electrode E1. The insulating layer 12 comprises an opening OP2, and a part of the lower electrode E1 is exposed in the opening OP2.

The organic layer OR is connected to the lower electrode E1 via the opening OP2. In this embodiment, the organic layer OR includes a light-emitting layer that emits light in one of the colors red, green, or blue. The organic layer OR may include, in addition to the light-emitting layer, functional layers such as a hole injection layer, a hole transport layer, an electron blocking layer, a hole blocking layer, an electron transport layer, an electron injection layer, and the like. For this reason, the organic layer OR may be of a stacked body in which a plurality of layers including at least one of the functional layers listed above are stacked, in addition to the light-emitting layer, though FIG. 2 illustrates the organic layer OR as a single layer.

The power supply line FL is disposed on the insulating layer 12. FIG. 2 shows an example case where the power supply line FL is placed between the organic layer OR of the subpixel SP1 contained in a pixel PX and the organic layer OR of the subpixel SP2 adjacent to the subpixel SP1, so as to partition these two organic layers OR from each other. Further, FIG. 2 shows an example case where the power supply line FL is located as well between a pixel PX and another pixel PX adjacent to the pixel PX, so as to partition the organic layer OR contained in the pixel PX (the organic layer OR contained in the subpixel SP2 of the pixel PX) and the organic layer OR contained in another adjacent pixel PX (the organic layer OR contained in the subpixel SP1 of another adjacent pixel PX). Thus, the pixels PX and the subpixels SP1, SP2 and SP3 contained in each pixel PX are partitioned from each other by the respective power supply lines FL.

The power supply line FL is made of, for example, a low-resistance metal material such as silver (Ag), aluminum (Al), titanium (Ti), molybdenum (Mo), tungsten (W) or the like. The power supply line FL may be a single layer formed of one of the metal materials listed above, or it may be a stacked body in which some of the metal materials mentioned above are stacked one on another.

Although the details thereof will be described later, the power supply line FL is drawn to the outside of the display unit DA and is connected to a switching circuit SW, which will be described later.

The upper electrode E2 is a common layer disposed over the predetermined number of pixels PX, and it covers the insulating layer 12 and the organic layer OR contained in the predetermined number of pixels PX, and is connected to the power supply line FL.

The upper electrode E2 is a transparent electrode formed of a transparent conductive material such as ITO or IZO. The upper electrode E2 may be a semi-transparent metal electrode formed of a metal material such as magnesium (Mg), silver (Ag), aluminum (Al) or the like.

When the potential of the lower electrode E1 is relatively higher than that of the upper electrode E2, the lower electrode E1 is equivalent to the anode and the upper electrode E2 is equivalent to the cathode.

When the potential of the upper electrode E2 is relatively higher than that of the lower electrode E1, the upper electrode E2 is equivalent to the anode and the lower electrode E1 is equivalent to the cathode. In this embodiment, such an example case is assumed, where the lower electrode E1 is equivalent to the anode and the upper electrode E2 is equivalent to the cathode.

According to the configuration shown in FIG. 2, the light-emitting area of the display device 20 can be formed in the area where the organic layer OR disposed between the lower electrode E1 in the opening OP2 and the upper electrode E2 placed as the common layer is located. However, the portion of the organic layer OR, which is disposed between the slope of the opening OP2 and the upper surface of the insulating layer 12 does not substantially emits light because the insulating layer 12 intervenes between the lower electrode E1 and the upper electrode E2.

FIG. 3 is a diagram showing a configuration example of the display device DSP of this embodiment. Of the configuration of the display device DSP, the portion related to the touch detection function will be described with reference to FIG. 3.

In the display unit DA, a plurality of pixels PX are arranged in a matrix along the first direction X and the second direction Y. As enlarged in FIG. 3, the sub-pixels SP1, SP2 and SP3 contained in one pixel PX are each formed into a rectangular shape extending along the second direction Y in the display unit DA. The sub-pixel SP1, which comprises a display element that emits light corresponding to the red wavelength and the subpixel SP2, which comprises a display element that emits light corresponding to the green wavelength, are arranged to be adjacent to each other along the second direction Y. Further, the subpixels SP1 and SP2, and the subpixel SP3, which comprises a display element that emits light corresponding to the blue wavelength, are arranged to be adjacent to each other along the first direction X. The size of the subpixels SP1 and SP2 (the area in the X-Y plane) is smaller than that of subpixel SP3.

Note here that the example case where the subpixels SP1, SP2 and SP3 are arranged in penta-tile fashion is provided, but the arrangement mode of the subpixels SP1, SP2 and SP3 is not limited to this. The subpixels SP1, SP2 and SP3 may be arranged in a stripe mode, for example.

In the display device DSP of this embodiment, the upper electrode E2 is used not only as an electrode for displaying images on the display unit DA by making the display elements contained in pixels PX to emit light, but also as a sensor electrode for detecting the approaching or contact of an external object (such as a user's finger). The sensor electrode may be referred to as a detection electrode. Further, in the following descriptions, "detecting the approaching or contact of an external object" may be referred to as "detecting touch".

As shown in FIG. 3, in the display unit DA, a plurality of upper electrodes E2 are disposed in a divided manner so that they do not overlap each other in plan view. Each upper electrode E2 is arranged over a predetermined number of pixels PX, and overlap the predetermined number of pixels PX in plan view. The number of pixels PX overlapping the upper electrode E2 in plan view may vary from one upper electrode E2 to another. In the following descriptions, two upper electrodes E2A and E2B shown in FIG. 3 will be focused.

The upper electrode E2A (the first upper electrode) is located adjacent to an edge EY of the display unit DA, which extends along the second direction Y, and is formed into a rectangular shape (more specifically, substantially a square shape). The upper electrode E2A should preferably be formed to have an area of, for example, about 5 mm×5 mm in the X-Y plane. Or, the upper electrode E2A should preferably be formed to have an area overlapping 50 pixels× 50 pixels, that is, 2500 pixels in plan view. Note that the upper electrode E2A may not be formed in substantially a square shape, but may as well be an elongated rectangular shape, for example. From one edge of the upper electrode E2A that extends along the second direction Y and is adjacent to the edge EY of the display unit DA, a power supply line FL is drawn from the display unit DA toward the switching circuit SW.

The upper electrode E2B (the second upper electrode) is formed into substantially an L-shape including a portion parallel to one edge of the upper electrode E2A extending along the first direction X and a portion parallel to one side of the upper electrode E2A extending along the second direction Y. The upper electrode E2B includes a body part E2B1 and a drawer part E2B2. The body part E2B1 and the drawer part E2B2 are formed to be integrated as one body.

The body part E2B1 is a part adjacent to the upper electrode E2A along the first direction X and is formed into a rectangular shape. One edge of the body part E2B1 extending along the second direction Y should preferably be formed longer than one edge of the upper electrode E2A extending along the second direction Y by at least the size of one pixel longer.

The drawer part E2B2 is a portion for drawing out the power supply line FL connected to the upper electrode E2B, from the display unit DA to the switching circuit SW and is aligned adjacent to the upper electrode E2A along the second direction Y. The drawer part E2B2 extends from the body part E2B1 toward the edge EY of the display unit DA. The drawer part E2B2 has a length (width) of at least the size of one pixel along the second direction Y. From an end portion of the drawer part E2B2 (more specifically, the edge of the drawer part E2B2 extending along the second direction Y and adjacent to the edge EY of the display unit DA), the power supply line FL is drawn out from the display unit DA toward the switching circuit SW.

All pixels PX overlapping the respective upper electrodes E2 in plan view constitute the image displayed on the display unit DA. In other words, the display elements 20 contained in the pixels PX overlapping the drawer parts E2B2 of the upper electrodes E2B in plan view also emit light to constitute the image displayed in the display unit DA.

As described above, the upper electrode E2B2 (the first upper electrode) adjacent to the edge EY of the display unit DA along the second direction Y is substantially square or rectangular in shape, and the power supply line FL is drawn out at one edge extending along the second direction Y. On the other hand, those upper electrodes E2 other than the upper electrode E2 (the second upper electrode) adjacent to the edge EY of the display unit DA along the second direction Y are formed into an L-shape and include a body part and a drawer part, and the power supply line FL is drawn out at the end portion of the drawer part.

Each switching circuit SW is placed between the respective upper electrode E2, the power supply circuit FC, and the touch controller TC. The switching circuit SW selectively switches between connecting each upper electrode E2 to the power supply circuit FC and connecting each upper electrode E2 to the touch controller TC.

In a display period (the first period) in which the display elements 20 contained in pixels PX are made to emit light to display the image on the display unit DA, the switching circuit SW connects each upper electrode E2 to the power supply circuit FC, and disconnects each upper electrode E2 from the touch controller TC. With this configuration, in the display period, the common potential is supplied to each upper electrode E2 via the respective power feed line FL. By supplying the common potential to each upper electrode E2, the display elements 20 contained in the pixels PX emit light to display the image on the display unit DA.

On the other hand, in a touch detection period (the second period) for detecting a touch, the switching circuit SW connects each upper electrode E2 to the touch controller TC, and disconnects the upper electrode E2 from the power supply circuit FC. With this configuration, in the touch detection period, the drive signal for touch detection is supplied to each upper electrode E2 via the respective power feed line FL. Each upper electrode E2 outputs a detection signal corresponding to the supplied drive signal to the touch controller TC via the power feed line FL. When the touch controller TC receives the input of the detection signal output from each upper electrode E2, it detects the touch based on the waveform of the detection signal. Note that the touch detection period is equivalent to the non-display period provided between one display period and the next. Further, the display period may as well be referred to as a light-emitting period because it is also the period in which the display elements 20 are made to emit light, as described above. In this case, the non-display period may be referred to as the non-light-emitting period.

Here, the effect of this embodiment will be described using the comparative example shown in FIG. 4. The comparative example is intended to illustrate some of the effects that can be achieved by this embodiment, and does not exclude the effects that are common to the comparative example and the present embodiment from the scope of the present embodiment.

Figure 4:
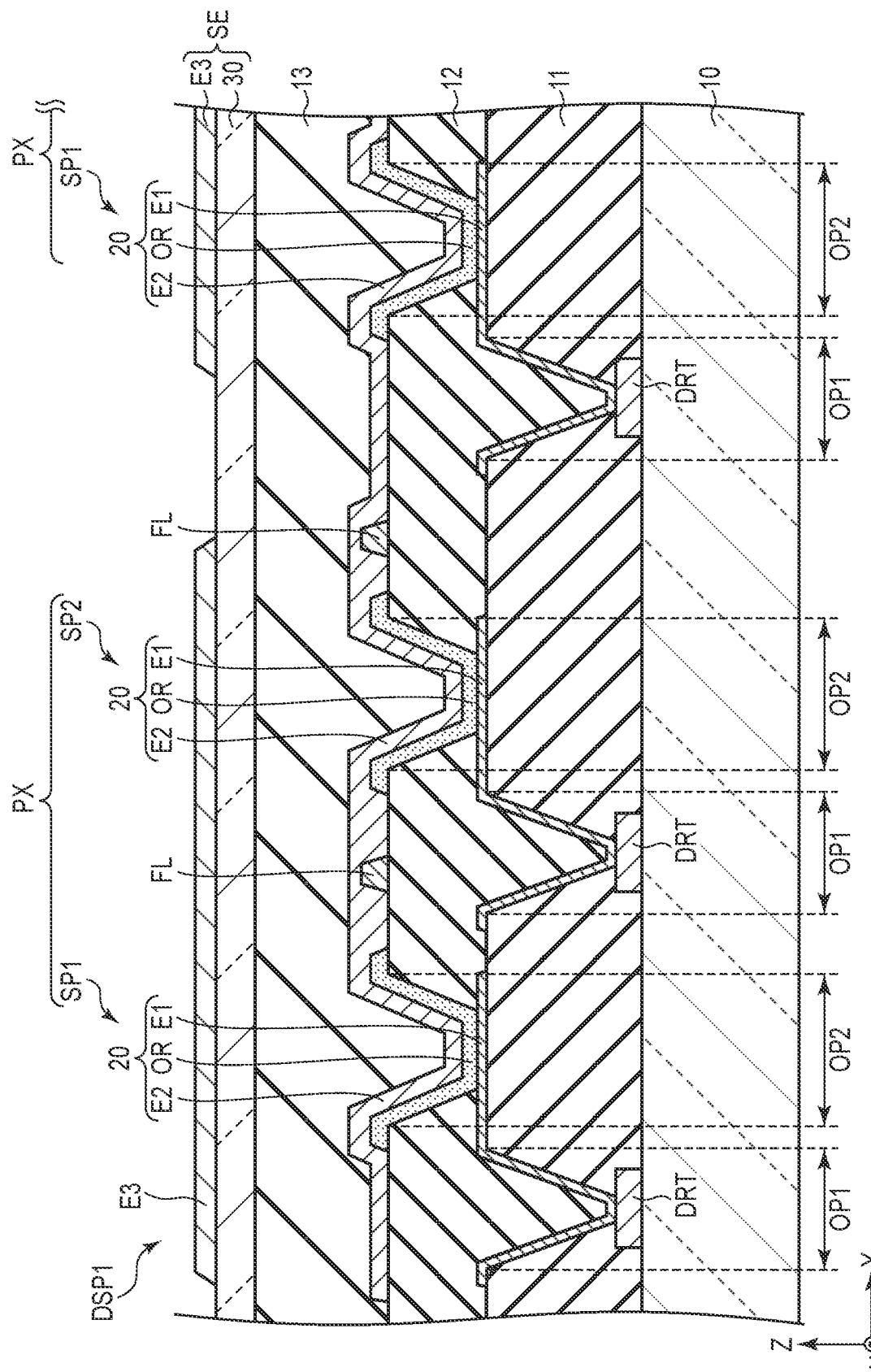
FIG. 4 is a cross-sectional view of a display device according to a comparative example.

A display unit DSP1 in the comparative example is different from the display unit DSP of this embodiment in that an external touch sensor SE is added as shown in FIG. 4. In other words, the display device DSP1 in the comparison example differs from the display device DSP of the present embodiment in that the upper electrode E2 contained in the display elements 20 does not function as sensor electrodes.

In the display device DSP1 in the comparative example, the upper electrode E2 is provided over the all pixels PX arranged in the display unit DA. On the upper electrode E2, a sealing layer 13 is disposed. The external touch sensor SE is disposed on the sealing layer 13. The external touch sensor SE comprises a base 30 and sensor electrodes E3 placed on the base 30. Although not shown in FIG. 4, a cover member and the like are further provided over the sensor electrodes E3.

Thus, in the display unit DSP1 in the comparative example, the thickness of the display device (the length along the third direction Z) is increased by the portion corresponding to the external touch sensor SE added, and therefore, this example entails such problems that the manufacturing cost and the number of manufacturing processes of the display device are increased.

On the other hand, in the display device DSP of this embodiment, the upper electrode E2 contained in the display elements 20 functions not only as an electrode to emit light and display an image on the display unit DA, but also as a sensor electrode to detect touch. In this manner, the external touch sensor SE can be omitted.

To make the upper electrode E2 to function also as a sensor electrode, it suffices if the following configurations are provided. That is, a plurality of upper electrodes E2 are provided in a divided manner each for a predetermined number of pixels PX, in the display period, each upper electrode E2 is connected to the power supply circuit FC, and each upper electrode E2 is disconnected from the touch controller TC, and in the touch detection period, each upper electrode E2 is connected to the touch controller TC, and each upper electrode E2 is disconnected from the power supply circuit FC. With this configuration, the touch controller TC supplies the drive signal for touch detection to each upper electrode E2 during the touch detection period, and detects a touch based on the detection signal output from each upper electrode E2 according to the drive signal.

As described above, the display device DSP in this embodiment exhibits the following advantages as compared to the display device DSP1 in the comparative example, that is, the thickness of the display device can be reduced by the amount equivalent to that the external touch sensor SE is omitted. Further, in the display device DSP in this embodiment, it is possible to reduce the manufacturing cost and the number of manufacturing processes of the display device as compared to the case of the display device DSP1 in the comparative example, by the amount equivalent to that the external touch sensor SE is omitted.

In this embodiment, the power supply line FL formed of a low-resistance metal material is connected to each upper electrode E2, and therefore it is also possible to reduce the resistance of each upper electrode E2.

According to the embodiment described above, the upper electrode E2 contained in the display element 20 can be made to function not only as an electrode to make the display element 20 to emit light to display an image on the display unit DA, but also a touch sensor for detecting a touch. Therefore, it is possible to provide a display device with a touch detection function without adding an external touch sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a substrate;
a display including a plurality of pixels arranged in a matrix along a first direction and a second direction intersecting the first direction on the substrate;
the plurality of pixels each comprising:
a display element including an anode, a cathode disposed to oppose the anode, and an organic layer including a light-emitting layer disposed between the anode and the cathode, and
the cathode being divided into plural cathodes each provided for a predetermined number of pixels;
the cathodes each comprising:
a first cathode adjacent to one edge of the display portion extending along the second direction; and
a second cathode other than the first cathodes,
the first cathode being formed into a rectangular shape,
the second cathode being formed into an L-shape including a main body portion adjacent to the first cathode along the first direction and a drawer portion extending from the main body portion toward the edge of the display unit, and
the second cathode being placed between two organic layers adjacent to each other and to partition each pixel.

2. The display device of claim 1, wherein
a first edge of the main body portion of the second cathode extending along the second direction is longer than a second edge of the first cathode extending along the second direction.

3. The display device according to claim 2, wherein
a difference between the first edge of the main body portion of the second cathode and the first edge of the first cathode is equivalent to a width of the drawer portion of the second cathode along the second direction.

4. The display device according to claim 1, further comprising:
a power supply circuit that supplies a potential to the display for displaying an image;
a touch controller that detects a touch with respect to the display;
a switching circuit disposed between the display, the power supply circuit, and the touch controller; and
a pixel circuit disposed on the substrate; wherein
the anode is connected to the pixel circuit,
the cathode is connected to the switching circuit, and
the switching circuit selectively switches between connecting the cathode to the power supply circuit and connecting the cathode to the touch controller.

5. The display device of claim 4, wherein
in a first period of displaying an image on the display, the switching circuit connects each of the cathodes to the power supply circuit and disconnects each of the cathodes from the touch controller, and
in a second period of detecting a touch with respect to the display, the switching circuit connects each of the cathodes to the touch controller and disconnects each of the cathodes from the power supply circuit.

6. The display device of claim 5, wherein
the power supply circuit supplies a common potential to each of the cathodes in the first period, and
the touch controller supplies a drive signal for touch detection to each of the cathodes in the second period, and detects a touch based on the detection signal output from each of the cathodes according to the drive signal.

* * * * *